(12) United States Patent
Yoon

(10) Patent No.: US 8,130,539 B2
(45) Date of Patent: Mar. 6, 2012

(54) PHASE CHANGE MEMORY DEVICE

(75) Inventor: Hyuck-Soo Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 186 days.

(21) Appl. No.: 12/487,707

(22) Filed: Jun. 19, 2009

(65) Prior Publication Data

US 2010/0290272 A1    Nov. 18, 2010

(30) Foreign Application Priority Data

May 12, 2009  (KR) .................... 10-2009-0041370

(51) Int. Cl.
  *G11C 11/00* (2006.01)
  *G11C 7/02* (2006.01)
(52) U.S. Cl. ..... 365/163; 365/207; 365/148; 365/210.1; 365/210.12
(58) Field of Classification Search ............... 365/148, 365/163, 207, 210.1, 210.12, 193, 194, 196
See application file for complete search history.

(56) References Cited

U.S. PATENT DOCUMENTS 7,336,544 B2 *  2/2008  Takemura ............. 365/189.08

FOREIGN PATENT DOCUMENTS

| KR | 100335397 | 9/2002 |
| KR | 1020040092750 | 11/2004 |
| KR | 100610008 | 8/2006 |
| KR | 100895389 | 4/2009 |

OTHER PUBLICATIONS

Notice of Allowance issued from Korean Intellectual Property Office on Nov. 30, 2010.

* cited by examiner

*Primary Examiner* — Alexander Sofocleous
*Assistant Examiner* — Hai Pham
(74) *Attorney, Agent, or Firm* — IP & T Group LLP

(57) ABSTRACT

A phase change memory device includes a signal generator configured to generate first and second sensing and amplifying enable signals which are sequentially activated during an activation period of a word line selection signal and each of which has a certain activation period length, a resistance sensor configured to sense a resistance value by applying a certain operation current to a phase change memory cell corresponding to the word line selection signal during an activation period of the first sensing and amplifying enable signal and a voltage level amplifier configured to logically determine a voltage level of the resistance sensing signal based on a voltage level of a logic reference signal during an activation period of the second sensing.

29 Claims, 4 Drawing Sheets

PHASE CHANGE MEMORY DEVICE

CROSS-REFERENCE TO RELATED APPLICATIONS

The present application claims priority of Korean Patent Application No. 10-2009-0041370, filed on May 12, 2009, the disclosure of which is incorporated herein by reference in its entirety.

BACKGROUND OF THE INVENTION

The present invention relates to a semiconductor design technology, and more particularly, to a sensing and amplifying circuit included in a phase change memory device and an operation thereof.

Many computer memory technologies have been introduced for storing computer programs and data. Such technologies include a dynamic random access memory (DRAM), a static random access memory (SRAM), an erasable programmable read only memory (EPROM), and an electrical erasable programmable read only memory (EEPROM). Some of memory technologies require an application of a voltage to retain stored data while others do not require such a voltage application in retaining stored data.

Lately, the demand of a non-volatile memory has increased due to the advantage of the non-volatile memory, which allows repetition of reading/writing data. EEPROM is one type of non-volatile memories. EEPROM uses a floating gate transistor for sustaining electric charges on an insulated floating gate. Each memory cell may be electrically programmed to "1" or "0" by injecting or removing electric charges to or from a floating gate. However, EEPROM has some shortcomings too. For example, it is difficult to reduce memory cells of EEPROM in size, EEPROM is comparatively slow to perform a read operation and a program operation, and EEPROM consumes comparatively large amount of power.

As to another type of non-volatile memory, a phase change memory device is formed of material that electrically changes structured states thereof, each of which represents different electric characteristics. For example, memory devices made of chalcogenide material as germanium·antimony·tellurium mixture (GST). The GST material may be programmed between an amorphous state representing a comparatively high resistivity and a crystalline state representing a comparatively low resistivity (for example, a resistivity lower than the comparatively high resistivity). The GST material is programmed by heating up the GST material. A heating temperature and time are decided depending on whether the GST material is left as an amorphous state or a crystalline state. The high resistivity and low resistivity denote programmed values "1" and "0". The programmed values can be sensed by measuring the resistivity of the GST material.

In order to perform a write operation for writing data at the GST material, that is, for programming the GST material as an amorphous state or a crystalline state, the structured state of the GST material is changed by applying a comparatively high current to the GST material.

On the contrary, in order to perform a read operation for reading a data value of the programmed GST in the amorphous state or the crystalline state, the resistance value of the GST material is sensed without changing the structured state of the GST material by applying comparatively low current to the GST material.

When a phase change memory device is designed to employ the GST material to form a memory cell, the phase change memory device includes a plurality of phase change memory cells formed of the GST material in an array like a typical semiconductor memory device such as a DRAM including memory cells formed of capacitors in an array.

That is, the phase change memory device performs data input/output operations by selecting one of the plurality of phase change memory cells made of GST material in an array by selection of a word line WL and a bit line BL like a DRAM that performs data input/output operation by selecting one of a plurality of memory cells formed in an array through selection of a word line WL and a bit line BL.

A typical DRAM should be controlled to begin sensing and amplifying data of a selected cell as soon as a word line WL is activated and to sustain this state until the word line WL is inactivated. If the typical DRAM terminates sensing and amplifying data of the selected cell while the word line WL is activated, the data of the selected cell may be impaired. Although the data of selected cell is not broken, refresh characteristics may be deteriorated due to lack of charged electric charge.

As described above, the typical DRAM should continuously retain sensing and amplifying data of a selected cell during the activation period of a word line when data input and output operations are performed by selecting one of a plurality of memory cells in an array.

A phase change memory device may employ the same method of the typical DRAM, which performs sensing and amplifying data of a selected phase change memory cell during the activation period of a word line WL when data is inputted/outputted by selecting one of a plurality of phase change memory cells in the phase change memory cell. When the phase change memory device employs this method, the phase change memory device can normally perform data input/output operations.

However, since a plurality of phase change memory cells are non-volatile, the phase change memory unnecessarily wastes power if the phase change memory continuously performs sensing and amplifying data of a selected phase change memory cell during an activation period of a word line WL when data is inputted/outputted by selecting one of phase change memory cells as in the typical DRAM.

In order words, since the plurality of phase change memory cells in the phase change memory device are non-volatile, a time required for inputting/outputting data is shorter than a time required for activating a word line WL. Therefore, if the phase change memory device continuously performs sensing and amplifying data of a selected phase change memory cell during activation of a word line WL, the phase change memory device unnecessarily wastes power during a time equal to as much as a difference between the time required for activating a word line WL and the time required for inputting/outputting data.

SUMMARY OF THE INVENTION

An embodiment of the present invention is directed to providing a sensing and amplifying circuit of a phase change memory device for independently deciding a time for sensing and amplifying data of a phase change memory cell regardless of a time corresponding to an activation period of a word line WL.

In accordance with an aspect of the present invention, there is provided a phase change memory device comprising a signal generator configured to generate first and second sensing and amplifying enable signals which are sequentially activated during an activation period of a word line selection signal and each of which has a certain activation period length, a resistance sensor configured to sense a resistance value by applying a certain operation current to a phase change memory cell corresponding to the word line selection signal during an activation period of the first sensing and amplifying enable signal and determine a voltage level of a resistance sensing signal corresponding to the sensed result and a voltage level amplifier configured to logically determine a voltage level of the resistance sensing signal based on a voltage level of a logic reference signal during an activation period of the second sensing and amplifying enable signal and output amplified resistance sensing signals by amplifying the determined voltage level of the resistance sensing signal.

In accordance with another aspect of the present invention, there is provided a phase change memory device comprising a signal generator configured to generate first and second sensing and amplifying enable signals which are sequentially activated during an activation period of a word line selection signal and each of which has a certain activation period length, a selected cell resistance sensor configured to sense a resistance value by applying a certain selected cell sensing operation current to a phase change memory cell corresponding to the word line selection signal during an activation period of the first sensing and amplifying enable signal and decide a voltage level of a resistance sensing signal corresponding to the sensed result, a reference cell resistance sensor configured to sense a resistance value of a reference cell by applying a certain reference cell sensing operation current to the reference cell during an activation period of the first sensing and amplifying enable signal and decide a voltage level of a logic reference signal corresponding to the sensed result and a voltage level amplifier configured to logically determine a voltage level of the resistance sensing signal based on a voltage level of the logic reference signal during an activation period of the second sensing and amplifying enable signal, amplify the voltage level of the resistance sensing signal, and output amplified resistance sensing signals.

DESCRIPTION OF SPECIFIC EMBODIMENTS

Other objects and advantages of the present invention can be understood by the following description, and become apparent with reference to the embodiments of the present invention.

Figure 1A:
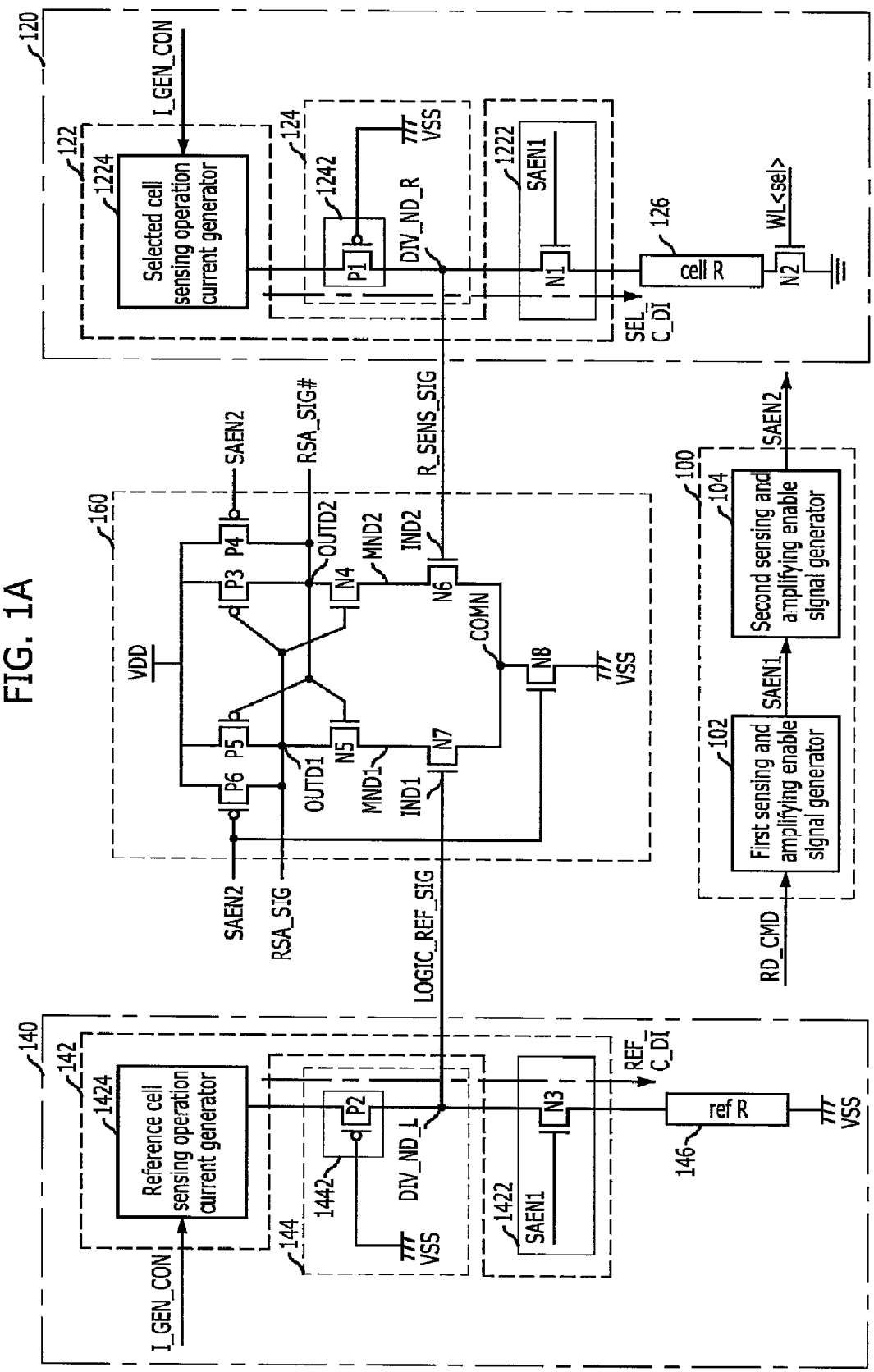
FIG. 1A is a circuit diagram illustrating a sensing and amplifying circuit of a phase change memory device in accordance with an embodiment of the present invention.

FIG. 1A is a circuit diagram illustrating a sensing and amplifying circuit of a phase change memory device in accordance with an embodiment of the present invention.

Referring to FIG. 1A, the sensing and amplifying circuit of the phase change memory device according to the present embodiment includes a signal generator 100, a selected cell resistance sensor 120, a reference cell resistance sensor 140, and a voltage level amplifier 160. The signal generator 100 generates a first sensing and amplifying enable signal ASEN1 and a second sensing and amplifying enable signal ASEN2, which are sequentially activated during an activation period of a word line selection signal WL<sel>. Each of the first and second sensing and amplifying enable signals SAEN1 and SAEN2 has a certain activation period length. The selected cell resistance sensor 120 senses a resistance value of a phase change memory cell 126 cellR corresponding to a word line selection signal WL<sel> by applying a selected cell sensing operation current SEL_C_DI to the phase change memory cell 126 cellR during an activation period of the first sensing and amplifying enable signal SAEN1 and decides a voltage level of a resistance sensing signal R_SENS_SIG corresponding to the sensed result. The reference cell resistance sensor 140 senses a resistance value of a reference cell 146 refR by applying a reference cell sensing operation current REF_C_DI to the reference cell 146 refR during an activation period of the first sensing and amplifying enable signal SAEN1 and decides a voltage level of a logic reference signal LOGIC_REF_SIG corresponding to the sensed result. The voltage level amplifier 160 logically determines a voltage level of a resistance sensing signal R_SENS_SIG based on a voltage level of a logic reference signal LOGIC_REF_SIG during an activation period of the second sensing and amplifying enable signal SAEN2 and outputs amplified resistance sensing signals RSA_SIG and RSA_SIG# by amplifying the voltage level of the resistance sensing signal R_SENS_SIG.

The signal generator 100 includes a first sensing and amplifying enable signal generator 102 and a second sensing and amplifying enable signal generator 104. The first sensing and amplifying enable signal generator 102 generates a first sensing and amplifying enable signal SAEN1 in response to a read command RD_CMD during an activation period of a word line selection signal WL<sel>. The second sensing and amplifying enable signal generator 104 generates a second sensing and amplifying enable signal SAEN2 in response to the first sensing and amplifying enable signal SAEN1 during an activation period of a word line selection signal WL<sel>.

The selected cell resistance sensor 120 includes a phase change memory cell cellR 126, a selected cell current applying unit 122, and a resistance sensing signal voltage level controller 124. The phase change memory cell cellR 126 is connected to a ground voltage terminal VSS in response to a word line selection signal WL<sel>. The selected cell current applying unit 122 applies a selected cell sensing operation current SEL_C_DI to the phase change memory cell cellR 126 corresponding a word line selection signal WL<sel> in response to the first sensing and amplifying enable signal SAEN1. The resistance sensing signal voltage level controller 124 decides a voltage level of a resistance sensing signal R_SENS_SIG based on a resistance value of a phase change memory cell cellR 126 corresponding to a word line selection signal WL<sel>, which is sensed through an operation of the selected cell current applying unit 122.

Also, the selected cell current applying unit 122 includes a selected cell sensing operation current generator 1224 and a selected cell current path controller 1222. The selected cell sensing operation current generator 1224 generates a selected cell sensing operation current SEL_C_DI in response to the current generation control signal I_GEN_CON. The selected cell current path controller 1222 controls switching on/off of a path for transferring the selected cell sensing operation current SEL_C_DI between the selected cell sensing operation current generator 1224 and a phase change memory cell cellR 126 corresponding to a word line selection signal WL<sel> in response to the first sensing and amplifying enable signal SAEN1.

Among the constituent elements of the selected cell resistance sensor 120, the selected cell current path controller 1222 of the selected cell current applying unit 122 includes an NMOS transistor N1 for controlling current flow from the selected cell sensing operation current generator 1224 to a phase change memory cell cellR 126 corresponding to a word line selection signal WL<sel> in response to the first sensing and amplifying enable signal SAEN1. The NMOS transistor N1 includes a gate for receiving the first sensing and amplifying enable signal SAEN1, a drain connected to the selected cell sensing operation current generator 1224, and a source connected to the phase change memory cell cellR 126.

Among the constituent elements of the selected cell resistance sensor 120, the resistance sensing signal voltage level controller 124 includes a dividing resistor 1242 having a certain resistance value and connected between the selected cell sensing operation current generator 1224 and the selected cell current path controller 1222 and outputs a resistance sensing signal R_SENS_SIG from a node DIV_ND_R disposed between the dividing resistor 1242 and the selected cell current path controller.

Among the constituent elements of the selected cell resistance sensor 120, the dividing resistor 124 of the resistance sensing signal voltage level controller 124 includes a PMOS transistor P1 having a certain fixed resistance value. The PMOS transistor P1 includes a gate connected to a ground voltage terminal VSS, a drain connected to the selected cell sensing operation current generator 1224, and a source connected to the selected cell current path controller 1222.

The reference cell resistance sensor 140 includes a reference cell refR 146, a reference cell current applying unit 142, and a logic reference signal voltage level controller 144. The reference cell current applying unit 142 applies a reference cell sensing operation current REF_C_DI to the reference cell refR 146 in response to a first sensing and amplifying enable signal SAEN1. The logic reference signal voltage level controller 144 decides a voltage level of a logic reference signal LOGIC_REF_SIG corresponding to a resistance value of the reference cell refR 146, which is sensed through the operation of the reference cell current applying unit 142.

Among the constituent elements of the reference cell resistance sensor 140, the reference cell current applying unit 142 includes a reference cell sensing operation current generator 1424 and a reference cell current path controller 1422. The reference cell sensing operation current generator 1424 generates a reference cell sensing operation current REF_C_DI in response to a current generating control signal I_GEN_CON. The reference cell current path controller 1422 controls switching on/off of a path for transferring a reference sensing operation current REF_C_DI between the reference cell sensing operation current generator 1424 and the reference cell refR 146 in response to a first sensing and amplifying enable signal SAEN1.

Among the constituent elements of the reference cell resistance sensor 140, the reference cell current path controller 1422 of the reference cell current applying unit 142 includes an NMOS transistor N3 for controlling the flow of a reference cell sensing operation current REF_C_DI from the reference cell sensing operation current generator 1424 to the reference cell refR 146 in response to the first sensing and amplifying enable signal SAEN1. The NMOS transistor N3 includes a gate for receiving the first sensing and amplifying enable signal SAEN1, a drain connected to the reference cell sensing operation current generator 1424 and a source connected to the reference cell refR 146.

Among the constituent elements of the reference cell resistance sensor 140, the logic reference signal voltage level controller 144 includes a dividing resistor 1442 having a certain resistance value and connected between the reference cell sensing operation current generator 1424 and the reference cell current path controller 1422, and a node DIV_ND_L disposed between the dividing resistor 142 and the reference cell current path controller 1422 for outputting a logic reference signal LOGIC_REF_SIG.

Among the constituent elements of the reference cell resistance sensor 140, the dividing resistor 1442 of the logic reference signal voltage level controller includes a PMOS transistor P2 that may be fixed with a certain resistance value. The PMOS transistor P2 includes a gate connected to a ground voltage terminal VSS, a drain connected to the reference cell sensing operation current generator 1424, and a source connected to the reference cell current path controller 1422.

The voltage level amplifier 160 includes a first input terminal IND1 for receiving a logic reference signal LOGIC_REF_SIG and a second input terminal IND2 for receiving a resistance sensing signal R_SENS_SIG, differentially amplifies the voltage level of the resistance sensing signal R_SENS_SIG based on a voltage level difference of two received signals, and outputs amplified resistance sensing signals RSA_SIG and RSA_SIG# with the amplified voltage level being sustained during an activation period of the second sensing and amplifying enable signal SAEN2.

Hereinafter, the configuration of the voltage level amplifier 160 will be described in more detail. The voltage level amplifier 160 includes NMOS transistors N4 to N7 and PMOS transistors P4 to P7. The NMOS transistor N7 includes a gate connected to the first input terminal IND1, a drain connected to a first middle node MND1, and a source connected to a common node COMN. The NMOS transistor N7 controls an amount of current flowing from the first middle node MND1 to the common node COMN in response to a logic reference signal LOGIC_REF_SIG applied through the first input terminal IND1. The NMOS transistor N6 includes a gate connected to the second input terminal IND2, a drain connected to a second middle node MND2, and a source connected to the common node COMN. The NMOS transistor N6 controls an amount of current flowing from the second middle node MND2 to the common node COMN in response to a resistance sensing signal R_SENS_SIG applied through the second input terminal IND2. The NMOS transistor N4 and the PMOS transistor P3 control a voltage level of a second output node OUTD2 in response to a voltage level of a first output node OUTD1 that shares charge with the first middle node NMD1 in an initial operation period. The NMOS transistor N5 and the PMOS transistor P5 control a voltage level of the first output node OUTD1 in response to a voltage level of a second output node OUTD2 that shares charge with the second middle node MND2 in an initial operation period. The PMOS transistor P6 includes a gate receiving a second sensing and amplifying enable signal SAEN2, a source connected to a supply voltage terminal VDD, and a drain connected to a first output node OUTD1. Such a PMOS transistor P6 controls switching on/off of connection from the supply voltage terminal VDD to the first output node OUTD1 in response to the second sensing and amplifying enable signal SAEN2. The PMOS transistor P4 includes a gate receiving a second sensing and amplifying enable signal SAEN2, a source connected a supply voltage terminal VDD, and a drain connected to a second output node OUTD2. The PMOS transistor P4 controls switching on/off of connection from the supply voltage terminal VDD to the second output node OUTD2 in response to the second sensing and amplifying enable signal SAEN2. The NMOS transistor N8 includes a gate receiving a second sensing and amplifying enable signal SAEN2, a drain connected to a common node COMN, and a source connected to a ground voltage terminal VSS. The NMOS transistor N8 controls switching on/off of connection from the common node COMN to the ground voltage terminal VSS in response to the second sensing and amplifying enable signal SAEN2.

In the description of the sensing and amplifying circuit of the phase change memory device according to the present embodiment, the phase change memory cell cellR 126 corresponding to the word line selection signal WL<sel> was mentioned previously. Although FIG. 1A shows only one phase change memory cell cellR 126, a phase change memory device may include a plurality of phase change memory cells. Accordingly, the phase change memory cell cellR 126 corresponding to the word line selection signal WL<sel> should be understood as one of the plurality of phase change memory cells, which is selected corresponding to a word line selection signal WL<sel> for sensing and amplifying corresponding data.

In other words, a phase change memory device includes a plurality of phase change memory cells on/off-controlled to be connected to a ground voltage terminal VSS based on a word line selection signal WL<sel> unlike FIG. 1A that shows only one phase change memory cell on/off-controlled based on a word line selection signal WL<sel>.

If a phase change memory device is designed to have a plurality of phase change memory cells arranged in an array, a signal corresponding to a row address is equivalent to a word line selection signal WL<sel> and a signal corresponding to a column address is equivalent to a first sensing and amplifying enable signal SAEN1 in the sensing and amplifying circuit of the phase change memory device according to the present embodiment shown in FIG. 1A. That is, since the first sensing and amplifying enable signal SAEN1 is a signal generated in response to a read command RD_CMD, the first sensing and amplifying enable signal SAEN1 is a signal corresponding to a column address. Accordingly, a line transferring a word line selection signal WL<sel> may be equivalent to a word line and a line transferring a selected cell sensing operation current SEL_C_DI may be equivalent to a bit line.

Although it is not shown in FIG. 1A, a sensing and amplifying circuit according to another embodiment of the present invention may have a following structure when a phase change memory device includes a plurality of phase change memory cells.

The sensing and amplifying circuit according to another embodiment includes a plurality of phase change memory cells cellR<0:N>, a signal generator 100, a resistance sensor 120, a reference cell resistance sensor 140, and a voltage level amplifier 160. The signal generator 100 generate a first sensing and amplifying enable signal SAEN1 and a second sensing and amplifying enable signal SAEN2, which are sequentially activated in response to read commands RD_CMD<0:N> corresponding to a column address during an activation period of a word line selection signal WL<sel> corresponding to a row address and each having a certain activation period. The resistance sensor 120 applies a selected cell sensing operation current SEL_C_DI to a phase change memory cell corresponding to a word line selection signal WL<sel> among the plurality of phase change memory cells cellR<0:N> during an activation period of a first sensing and amplifying enable signal SAEN1, senses a resistance value of the phase change memory cell, and decides a voltage level of a resistance sensing signal R_SENS_SIG corresponding to the sensed result. The reference cell resistance sensor 140 applies a certain reference cell sensing operation current REF_C_DI to a reference cell refR 146 during an activation period of a first sensing and amplifying enable signal SAEN1, senses a resistance value of the reference cell refR 146, and decides a voltage level of a logic reference signal LOGIC_REF_SIG corresponding to the sensed result. The voltage level amplifier 160 logically determines a voltage level of a resistance sensing signal R_SENS_SIG based on a voltage level of the logic reference signal LOGIC_REF_SIG during an activation period of a second sensing and amplifying enable signal SAEN2, amplifies the voltage level of the resistance sensing signal R_SENS_SIG, and outputs amplified resistance sensing signals RSA_SIG and RSA_SIG#.

Although the phase change memory device includes a plurality of phase change memory cells, the configuration of the sensing and amplifying circuit is identical to that shown in FIG. 1A. Accordingly, the detail description thereof is omitted.

For illustration purposes, the reference cell refR 146 included in the reference cell resistance sensor 140 is a phase change memory cell that determines a voltage level of a logic reference signal LOGIC_REF_SIG. Although FIG. 1A shows the selected cell resistance sensor 120 that includes a number of reference cells that are as many as there are phase change memory cells because FIG. 1A shows the reference cell as elements corresponding to the selected cell resistance sensor 120, the phase change memory device includes significantly less reference cells than phase change memory cells. That is, logic levels of resistance sensing signals R_SENS_SIG<0:N> corresponding to a plurality of phase change memory cells are determined based on a logic reference signal LOGIC_REF_SIG having a voltage level decided by a reference cell.

Since the reference cell refR 146 may be used to determine a logical level of data stored in a plurality of phase change memory cells, the reference cell refR 146 may be formed by serially connecting a phase change memory cell storing data of logic high with a phase change memory cell storing data of logic low.

However, it is not necessary to include the reference cell refR 146 as shown in FIG. 1A. Unlike FIG. 1A, a phase change memory device may normally perform a sensing and amplifying operation without the reference cell resistance sensor 140. The phase change memory device may receive a logic reference signal LOGIC_REF_SIG from an external device or may generate a logic reference signal LOGIC_REF_SIG using an internal voltage generating circuit. Further, the logic reference signal LOGIC_REF_SIG may be previously stored in a certain register such as MRS.

A sensing and amplifying circuit of a phase change memory device according to another embodiment of the present invention may have a following structure when the phase change memory device receives a logic reference signal LOGIC_REF_SIG from an external device, when the phase change memory device generates a logic reference signal LOGIC_REF_SIG using a voltage generating circuit additionally included therein, or when the logic reference signal LOGIC_REF_SIG is previously stored in a certain register such as MRS.

The sensing and amplifying circuit includes a signal generator 100, a resistance sensor 120, and a voltage level amplifier 160. The signal generator 100 generates a first sensing and amplifying enable signal SAEN1 and a second sensing and amplifying enable signal SAEN2, which are sequentially activated in an activation period of a word line selection signal WL<sel> and each having a certain activation period length. The resistance sensor 120 applies a certain operation current SEL_C_DI to a phase change memory cell cellR 126 corresponding to a word line selection signal WL<sel> during an activation period of a first sensing and amplifying enable signal SAEN1, senses a resistance value thereof, and decides a voltage level of a resistance sensing signal R_SENS_SIG corresponding to the sensed result. The voltage level amplifier 160 logically determines a voltage level of a resistance sensing signal R_SENS_SIGN based on a voltage level of a logic reference signal LOGIC_REF_SIG during an activation period of a second sensing and amplifying enable signal SAEN2 and outputs amplified resistance sensing signals RSA_SIG and RSA_SIG# by amplifying the voltage level of the resistance sensing signal R_SENS_SIGN. The logic reference signal LOGIC_REF_SIG may be inputted from an external device through an additional input pad or generated by an internal voltage generating circuit.

As described above, the sensing and amplifying circuit of the phase change memory device can normally perform a sensing and amplifying operation although the reference cell resistance sensor is not included in the phase change memory device as shown in FIG. 1A. Since the operation thereof is identical that described with reference to FIG. 1, detail description thereof is omitted.

Figure 1B:
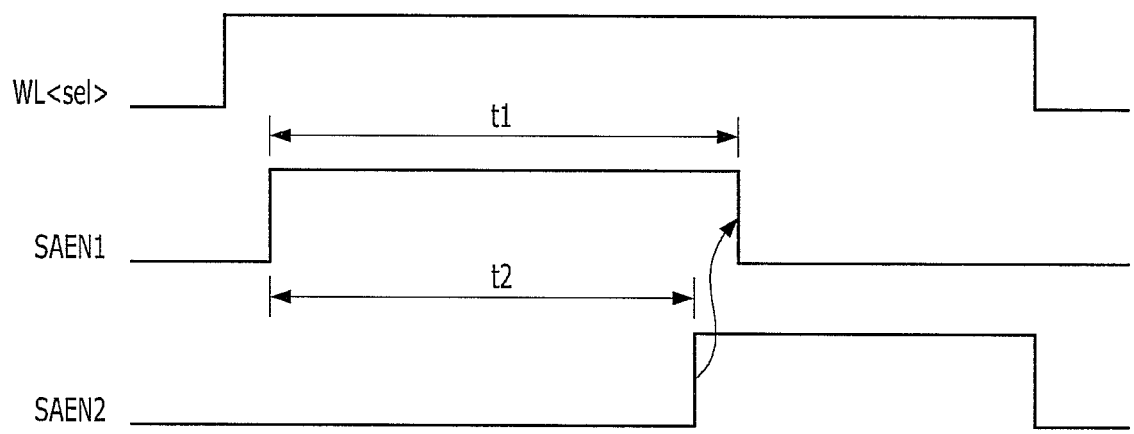
FIG. 1B is a diagram illustrating waveforms of a word line selection signal and first and second sensing and amplifying enable signals for controlling operation of a sensing and amplifying circuit of a phase change memory device shown in FIG. 1A.

FIG. 1B illustrates waveforms of a word line selection signal and first and second sensing and amplifying enable signals for controlling operation of a sensing and amplifying circuit of a phase change memory device shown in FIG. 1A.

The operation of a sensing and amplifying circuit of a phase change memory device according to an embodiment of the present invention will be described with reference to FIG. 1B.

Among constituent elements of the signal generator 100, the first sensing and amplifying enable signal generator 102 activates a first sensing and amplifying enable signal SAEN1 to logic high in response to a read command RD_CMD after the word line selection signal WL<sel> is activated to logic high. The first sensing and amplifying enable signal generator 102 inactivates the first sensing and amplifying enable signal SAEN1 to logic low after a first time t1 passes after the activation time of the first sensing and amplifying enable signal SAEN1, which is before the word line selection signal WL<sel> is inactivated to logic low.

When the first sensing and amplifying enable signal SAEN1 is activated to logic high as described above, the selected cell current applying unit 122 among the constituent elements of the selected cell resistance sensor 120 applies a selected cell sensing operation current I_GEN_CON to a phase change memory cell cellR 126 corresponding to the word line selection signal WL<sel>.

If the phase change memory cell cellR 126 corresponding to the word line selection signal WL<sel> becomes an amorphous state and has a comparatively high resistance value, the high resistance value makes it difficult for the selected cell sensing operation current I_GEN_CON to flow to a ground voltage terminal VSS through the phase change memory cell cellR 126 corresponding to the word line selection signal WL<sel>. As a result, a voltage level of a resistance sensing signal R_SENS_SIG increases significantly.

On the contrary, if the phase change memory cell cellR 126 corresponding to the word line selection signal WL<sel> becomes a crystalline state and has a comparatively low resistance value, the low resistance value makes it easier for the selected cell sensing operation current I_GEN_CON to flow to the ground voltage terminal VSS through the phase change memory cell cellR 126 corresponding to the word line selection signal WL<sel>. As a result, the voltage level of the resistance sensing signal R_SENS_SIG is increases comparatively slightly.

When the first sensing and amplifying enable signal SAEN1 is activated to logic high, the reference cell current applying unit 142 among the constituent elements of the reference cell resistance sensor 140 applies a reference cell sensing operation current REF_C_DI to a reference cell refR 146 corresponding to a word line selection signal WL<sel>.

Since the reference cell refR 146 is serially connected to a phase change memory cell in an amorphous state and a phase change memory cell in a crystalline state, the amplitude of the reference cell sensing operation current REF_C_DI flowing to the ground voltage terminal VSS through the reference cell refR 146 becomes relatively not too high and not too low. Accordingly, the amplitude of the logic reference signal LOGIC_REF_SIG also becomes relatively not too high and not too low.

As described above, the voltage level of the resistance sensing signal R_SENS_SIG and the voltage level of the logic reference signal LOGIC_REF_SIG should be decided before a second time t2 passes after the first sensing and amplifying enable signal SAEN1 is activated to logic high. When the voltage levels are decided after the second time t2 passes, the second sensing and amplifying enable signal SAEN2 is activated to logic high as shown in FIG. 1B.

In other words, the second sensing and amplifying enable signal generator 104 among the constituent elements of the signal generator 100 activates a second sensing and amplifying enable signal SAEN2 to logic high at a second time t2 passed after the first sensing and amplifying enable signal SAEN1 is activated to logic high. The second time t2 is shorter than the first time t1. Further, the second sensing and amplifying enable signal generator 104 inactivates the second sensing and amplifying enable signal SAEN2 to logic low when a word line selection signal WL<sel> is inactivated to logic low.

When the second sensing and amplifying enable signal SAEN2 is activated to logic high as described above, the voltage level amplifier 160 decides logic levels of amplified resistance sensing signals RSA_SIG and RSA_SIG#.

In more detail, the voltage level amplifier 160 determines a logic level of data stored in a phase change memory cell cellR 126 corresponding to a resistance sensing signal R_SENS_SIG as logic high if a voltage level of a logic reference signal LOGIC_REF_SIG is higher than a logic level of a resistance sensing signal R-SENS_SIG after the second sensing and amplifying enable signal SAEN2 is activated to logic high. Based on the determination result, the voltage level amplifier 160 amplifies the voltage level of the resistance sensing signal R_SENS_SIG to the supply voltage level and outputs the amplified resistance sensing signals RSA_SIG and RSA_SIG#. That is, a voltage level of a main amplified resistance sensing signal RSA_SIG is controlled to be a supply voltage VDD level, and a voltage level of a sub amplified resistance sensing signal RSA_SIG# is controlled to be a ground voltage VSS level.

The voltage level amplifier 160 determines a logic level of data stored in a phase change memory cell cellR 126 corresponding to a resistance sensing signal R_SENS_SIG when a voltage level of the resistance sensing signal R_SENS_SIG is lower than a voltage level of a logic reference signal LOGIC_REF_SIG after the second sensing and amplifying enable signal SAEN2 is activated to logic high. Accordingly, the voltage level amplifier 160 amplifies a voltage level of the resistance sensing signal R_SENS_SIG to a ground voltage VSS level and outputs the amplified resistance sensing signals RSA_SIG and RSA_SIG#. That is, the voltage level of the main amplified resistance sensing signal RSA_SIG is controlled to be a ground voltage VSS level and the voltage level of the sub amplified resistance sensing signal RSA_SIG# is controlled to be a supply voltage VDD level.

As described above, the sensing and amplifying circuit according to the present embodiment uses the first and second sensing and amplifying enable signals SAEN1 and SAEN2, which are sequentially activated during an activation period of a word line selection signal WL<sel> and each of which has a certain activation period length. Therefore, the sensing and amplifying circuit according to the present embodiment consumes significantly less power by performing operations step-by-step.

In other words, the sensing and amplifying circuit according to the present embodiment firstly activates a resistance value sensing block and performs related operations corresponding to a first sensing and amplifying enable signal SAEN1 which is inactivated comparatively ahead. Then, the sensing and amplifying circuit according to the present embodiment activates a resistance sensing signal amplifying block corresponding to the sensed resistance value comparatively and performs related operations corresponding to the second sensing and amplifying enable signal SAEN2 which is inactivated comparatively later. Therefore, the sensing and amplifying circuit according to the present embodiment activates the constituent elements thereof during a minimum time required to perform related operation regardless of a time for retaining an activation state of a word line selection signal WL<sel>. As a result, the sensing and amplifying circuit according to the present embodiment consumes the minimum current.

Therefore, it is possible to minimize current flowing into each of phase change memory cells in a phase change memory device. It means that stress applied to each of the phase change memory cells is minimized. As a result, each of the phase change memory cell may stably operate further longer.

However, the voltage level amplifier 160 operates during the activation period of the second sensing and amplifying enable signal SAEN2 and decides logic levels of amplified resistance sensing signals RSA_SIG and RSA_SIG#. The activation the point of time for the second sensing and amplifying enable signal SAEN2 is decided in response to the first sensing and amplifying enable signal SAEN1 while a word line selection signal WL<sel> is activated to logic high. After the second sensing and amplifying enable signal SAEN2 is activated to logic high, the second sensing and amplifying enable signal SAEN2 sustains the activation state of logic high until the word line selection signal WL<sel> is inactivated to logic low. Then, the second sensing and amplifying enable signal SAEN2 is inactivated.

Although the voltage level amplifier 160 does not take a long time to amplify a voltage level of a resistance sensing signal R_SENS_SIG, a period of retaining the logic high activation state of the second sensing and amplifying enable signal SAEN2 is comparatively long.

Since the voltage level amplifier 160 is a latch type, the voltage levels of the amplified resistance sensing signals RSA_SIG and RSA_SIG# are retained as a sensing amplified state only during the period of sustaining the logic high activation state of the second sensing and amplifying enable signal SAEN2. Therefore, the period of sustaining the logic high activation state of the second sensing and amplifying enable signal SAEN2 is comparatively long.

However, more current the voltage level amplifier 160 consumes, longer the period of sustaining the logic high activation state of the second sensing and amplifying enable signal SAEN2 becomes. In order to reduce power consumption slightly more, the voltage level amplifier 160 may be modified to have a structure shown in FIG. 2A.

Figure 2A:
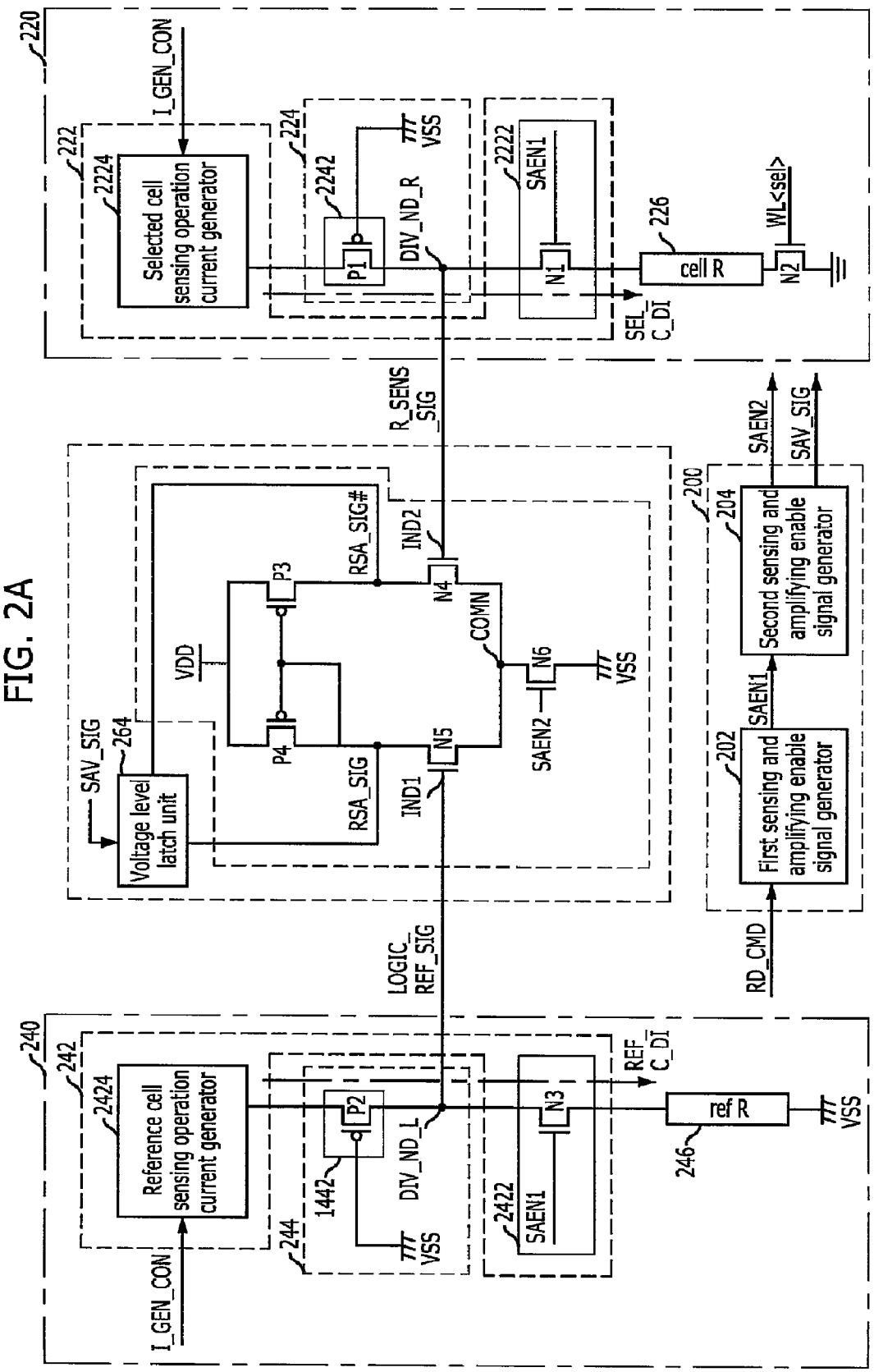
FIG. 2A is a circuit diagram illustrating a sensing and amplifying circuit of a phase change memory device in accordance with another embodiment of the present invention.

FIG. 2A is a circuit diagram illustrating a sensing and amplifying circuit of a phase change memory device according to another embodiment of the present invention.

As shown in FIG. 2A, the sensing and amplifying circuit according to another embodiment of the present invention includes constituent elements identical to those of the sensing and amplifying circuit of FIG. 1A except a signal generator 200 and a voltage level amplifier 260.

Like the sensing and amplifying circuit of FIG. 1A, the sensing and amplifying circuit of FIG. 2A includes a signal generator 200, a selected cell resistance sensor 220, a reference cell resistance sensor 240, and a voltage level amplifier 260.

The selected cell resistance sensor 220 and the reference cell resistance sensor 240 are identical to the selected cell resistance sensor 120 and the reference cell resistance sensor 140 of FIG. 1A. Therefore, detail description thereof is omitted.

Hereinafter, the signal generator 200 will be described with reference to FIG. 2A. The signal generator 200 includes a first sensing and amplifying enable signal generator 202 and a second sensing and amplifying enable signal generator 204. The first sensing and amplifying enable signal generator 202 generates a first sensing and amplifying enable signal SAEN1 in response to a read command RD_CMD during an activation period of a word line selection signal WL<sel>. The second sensing and amplifying enable signal generator 204 generates a signal saving signal SAV_SIG and a second sensing and amplifying enable signal SAEN2 in response to the first sensing and amplifying enable signal SAEN1 during the activation period of the word line selection signal WL<sel>.

Hereinafter, the voltage level amplifier 260 will be described with reference to FIG. 2A. The voltage level amplifier 260 includes a sensing and amplifying unit 262 and a voltage level latch unit 264. The sensing and amplifying unit 262 receives a logic reference signal LOGIC_REF_SIG through a first input terminal OUTD1 and a resistance sensing signal R_SENS_SIG through a second input terminal IND2, differentially amplifies the resistance sensing signal R_SENS_SIG based on a voltage level difference of the received two signals during an activation period of the second sensing and amplifying enable signal SAEN2 and outputs the amplified resistance sensing signals RSA_SIG and RSA_SIG#. The voltage level latch unit 264 latches voltage levels of the amplified resistance sensing signals RSA_SIG and RSA_SIG# in response to a signal saving signal SAV_SIG that toggles during the activation period of the second sensing and amplifying enable signal SAEN2.

Hereinafter, the sensing and amplifying unit 262 of the voltage level amplifier 260 will be described in more detail. The sensing and amplifying unit 262 includes NMOS transistors N4, N5, and N6, and PMOS transistors P3 and P4. The NMOS transistor N5 includes a gate connected to a first input terminal IND1, a drain connected to a first output node OUTD1, and a source connected to a common node COMN. The NMOS transistor N5 controls an amount of current flowing from the first output node OUTD1 connected to the drain to the common node COMN connected to the source in response to a logic reference signal LOGIC_REF_SIG applied through the first input terminal IND1. The NMOS transistor N4 includes a gate connected to a second input terminal IND2, a drain connected to a second output node OUTD2, and a source connected to a common node COMN.

The NMOS transistor N4 controls an amount of current flowing from the second output node OUTD2 to the common node COMN in response to a resistance sensing signal R_SENS_SIG applied through the second input terminal IND2. The PMOS transistors P3 and P4 are connected to each others in current mirror in order to control voltage levels of a first output node OUTD1 and a second output node OUTD2 in response to a voltage level of the first output node OUTD1. The NMOS transistor N6 includes a gate for receiving the second sensing and amplifying enable signal SAEN2, a drain connected to a common node COMN, and a source connected to a ground voltage terminal VSS. The NMOS transistor N6 controls switching on/off of connection of the common node COMN and the ground voltage terminal VSS in response to the second sensing and amplifying enable signal SAEN2.

The voltage level amplifier 260 receives a logic reference signal LOGIC_REF_SIG through a first input terminal IND1 and a resistance sensing signal R_SENS_SIG through a second input terminal IND2, differentially amplifies the voltage level of the resistance sensing signal R_SENS_SIG based on a voltage level difference of the two received signals, latches the amplified voltage level, and outputs amplified resistance sensing signals RSA_SIG and RSA_SIG#.

The voltage level amplifier 260 will be described in more detail. The voltage level amplifier 260 includes NMOS transistors N4, N5, N6, and N7, and PMOS transistors P3, P4, P5, and P6. The NMOS transistor N7 includes a gate connected to a first input terminal IND1, a drain connected to a first middle node MND1, and a source connected to a common node COMN. The NMOS transistor N7 controls an amount of current flowing from the first middle node to the common node COMN in response to a logic reference signal LOGIC_REF_SIG applied through the first input terminal IND1. The NMOS transistor N6 includes a gate connected to a second input terminal IND2, a drain connected to a second middle node MND2, and a source connected to a common node COMN. Such a NMOS transistor N6 controls an amount of current flowing from the second middle node MND2 to the common node COMN in response to a resistance sensing signal R_SENS_SIG applied through the second input terminal IND2. The NMOS transistor N4 and the PMOS transistor P3 control a voltage level of a second output node OUTD2 in response to a voltage level of the first output node OUTD1 that shares charge with the first middle node MND1 in an initial operation period. The NMOS transistor N5 and the PMOS transistor P5 control a voltage level of a first output node OUTD1 in response to a voltage level of a second output node OUTD2 that shares charge with the second middle node MND2 in an initial operation period. The PMOS transistor P6 includes a gate for receiving a second sensing and amplifying enable signal SAEN2, a source connected to a supply voltage terminal VDD, and a drain connected to a first output node OUTD1. The PMOS transistor P6 controls switching on/off of connection from the supply voltage terminal VDD to the first output node OUTD1 in response to the second sensing and amplifying enable signal SAEN2. The PMOS transistor P4 includes a gate for receiving a second sensing and amplifying enable signal SAEN2, a source connected to a supply voltage terminal VDD, and a drain connected to a second output node OUTD2. Such a PMOS transistor P4 controls switching on/off of connection from the supply voltage terminal VDD to the second output node OUTD2 in response to the second sensing and amplifying enable signal SAEN2. The NMOS transistor N8 includes a gate for receiving a second sensing and amplifying enable signal SAEN2, a drain connected to a common node COMN, and a source connected to a ground voltage terminal VSS. Such an NMOS transistor N8 controls switching on/off of connection from the common node COMN to the ground voltage terminal VSS in response to the second sensing and amplifying enable signal SAEN2.

Figure 2B:
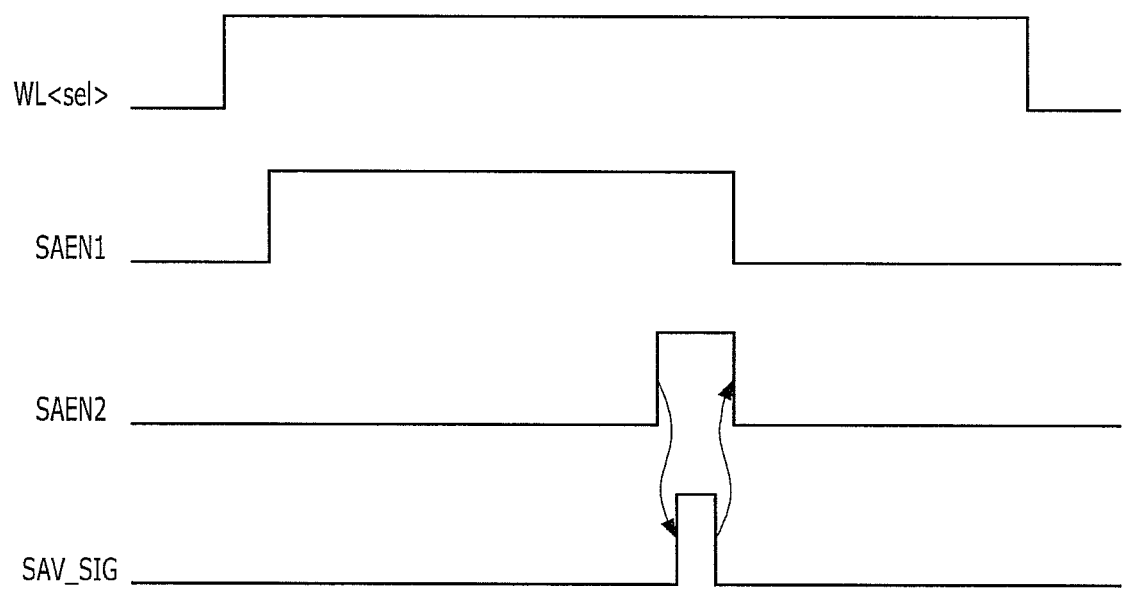
FIG. 2B is a diagram illustrating waveforms of a word line selection signal and first and second sensing and amplifying enable signals for controlling operation of a sensing and amplifying circuit of a phase change memory device shown in FIG. 2A.

FIG. 2B is a diagram illustrating waveforms of a word line selection signal and first and second sensing and amplifying enable signals for controlling operation of a sensing and amplifying circuit of a phase change memory device of FIG. 2A.

With reference to FIG. 2B, the operation of a sensing and amplifying circuit of a phase change memory device according to an embodiment of the present invention shown in FIG. 2A will be described.

Among constituent elements of the signal generator 200, the first sensing and amplifying enable signal generator 202 activates a first sensing and amplifying enable signal SAEN1 to logic high in response to a read command RD_CMD after a word line selection signal WL<sel> is activated to logic high. Then, the first sensing and amplifying enable signal generator 202 inactivates the first sensing and amplifying enable signal SAEN1 to logic low after a first time t1 passes after the activating the first sensing and amplifying enable signal SAEN1, which is a time before the word line selection signal WL<sel> is inactivated to logic low.

When the first sensing and amplifying enable signal SAEN1 is activated to logic high as described above, the selected cell current applying unit 222 applies a selected cell sensing operation current I_GEN_CON to a phase change memory cell cellR 226 corresponding to a word line selection signal WL<sel>.

If the phase change memory cell cellR 226 corresponding to the word line selection signal WL<sel> becomes an amorphous state and has a comparatively high resistance value, the high resistance value makes it difficult for the selected cell sensing operation current I_GEN_CON to flow to a ground voltage terminal VSS through the phase change memory cell cellR 226 corresponding to the word line selection signal WL<sel> as much as the high resistance value. Accordingly, the voltage level of the resistance sensing signal R_SENS_SIG increases significantly.

On the contrary, if a phase change memory cell cellR 226 corresponding to a word line selection signal WL<sel> becomes a crystalline state and has a comparatively low resistance value, the low resistance value make it easier for the selected cell sensing operation current I_GEN_CON to flow to the ground voltage terminal VSS through the phase change memory cell cellR 226 corresponding to the word line WL<sel>. Accordingly, the voltage level of the resistance sensing signal R_SENS_SIG increases slightly.

If the first sensing and amplifying enable signal SAEN1 is activated to logic high, the reference cell current applying unit 242 applies the reference cell sensing operation current REF_C_DI to a reference cell refR 246 corresponding to a word line selection signal WL<sel>.

Since the reference cell refR 246 is serially connected to a phase change memory cell in an amorphous state and a phase change memory cell in a crystalline state, the reference cell sensing operation current REF_C_DI flowing to the ground voltage terminal VSS through the reference cell refR 246 has a certain amplitude which is relatively not too high and not too low. Therefore, the logic reference signal LOGIC_REF_SIG always has a certain voltage level that is relatively not too high and not too low.

As described above, the voltage levels of the resistance sensing signal R_SENS_SIG and the logic reference signal LOGIC_REF_SIG should be decided before a second time t2 passes after a first sensing and amplifying enable signal SAEN1 is activated to logic high. When the voltage levels of the resistance sensing signal R_SENS_SIG and the logic reference signal LOGIC_REF_SIG are decided after the second time t2 passes, a second sensing and amplifying enable signal SAEN2 is activated to logic high as shown in FIG. 2B.

That is, among the constituent elements of the signal generator 200, the second sensing and amplifying enable signal generator 204 activates a second sensing and amplifying enable signal SAEN2 to logic high as soon as a second time t2 passed after a first sensing and amplifying enable signal SAEN1 is activated to logic high. Here, the second time t2 is shorter than the first time t1. In response to the activation of the second sensing and amplifying enable signal SAEN2, a signal saving signal SVA_SIG is toggled and instantly activated to logic high. Then, the signal saving signal SAV_SIG is inactive to logic low. In response to the inactivation of the signal saving signal SAV_SIG, the second sensing and amplifying enable signal SAEN2 is inactivated to logic low.

Therefore, among constituent elements of the voltage level amplifier 260, the sensing and amplifying unit 262 amplifies voltage levels of amplified resistance sensing signals RSA_SIG and RSA_SIG# while the second sensing and amplifying enable signal SAEN2 sustains the activation state as logic high. The voltage level latch unit 264 latches the voltage levels of amplified resistance sensing signals RSA_SIG and RSA_SIG# in response to the signal saving signal SAV_SIG toggled while the second sensing and amplifying enable signal SAEN2 sustains the activation state as logic high.

A point of time for inactivating the second sensing and amplifying enable signal SAEN2 to logic low is not related to a point of time for inactivating a word line selection signal WL<sel> to logic low except that the point of time for inactivating the second sensing and amplifying enable signal SAEN2 is ahead the point of time for inactivating a word line selection signal WL<sel>.

The points of time are not related to each other because the second sensing and amplifying enable signal SAEN2 is inactivated to logic low and the sensing and amplifying unit 262 does not operate any more after the voltage level latch unit 264 latches the voltage levels of the amplified resistance sensing signals RSA_SIG and RSA_SIG#.

In more detail, among the constituent elements of the voltage level amplifier 260, the sensing and amplifying unit 262 determines a logic level of data stored in a phase change memory cell cellR 226 corresponding to a resistance sensing signal R_SENS_SIG as logic high if a voltage level of a resistance sensing signal R_SENS_SIG is higher than a voltage level of a logic reference signal LOGIC_REF_SIG while the second sensing and amplifying enable signal SAEN2 is activated to logic high. Accordingly, the sensing and amplifying unit 262 amplifies a voltage level of a resistance sensing signal R_SENS_SIG to a supply voltage VDD level and outputs amplified resistance sensing signals RSA_SIG and RSA_SIG#. That is, the sensing and amplifying unit 262 controls a voltage level of a main amplified resistance sensing signal RSA_SIG to a supply voltage VDD level and controls a voltage level of a sub amplified resistance sensing signal RSA_SIG# to a ground voltage VSS level.

Among the constituent elements of the voltage level amplifier 260, the voltage level latch unit 264 latches the amplified resistance sensing signals RSA_SIG and RSA_SIG# from the sensing and amplifying unit 262 and outputs the latched signals. Here, the voltage level latch unit 264 controls the voltage level of main amplified resistance sensing signal RSA_SIG to be the supply voltage VDD level and controls the voltage level of sub amplified resistance sensing signal RSA_SIG# to be the ground voltage VSS level.

Among the constituent elements of the voltage level amplifier 260, the sensing and amplifying unit 262 determines a logic level of data stored in a phase change memory cell cellR 226 corresponding to a resistance sensing signal R_SENS_SIG as logic low when a voltage level of the resistance sensing signal R_SENS_SIG is lower than a voltage level of a logic reference signal LOGIC_REF_SIG after the second sensing and amplifying enable signal SAEN2 is activated to logic high. Accordingly, the sensing and amplifying unit 262 amplifies a voltage level of the resistance sensing signal R_SENS_SIG to a ground voltage VSS level and outputs amplified resistance sensing signals RSA_SIG and RSA_SIG#. That is, the sensing and amplifying unit 262 controls the voltage level of the main amplified resistance sensing signal RSA_SIG to be the ground voltage VSS level and controls the voltage level of the sub amplified resistance sensing signal RSA_SIG# to be a supply voltage VSS level.

Among the constituent elements of the voltage level amplifier 260, the voltage level latch unit 264 latches the amplified resistance sensing signals RSA_SIG and RSA_SIG# from the sensing and amplifying unit 262 and outputs the latched signals. That is, the voltage level latch unit 264 controls the voltage level of the main amplified resistance sensing signal RSA_SIG to be a ground voltage VSS level and controls the voltage level of the sub amplified resistance sensing signal RSA_SIG# to be a supply voltage VDD level.

Among the constituent elements of the voltage level amplifier 260, the sensing and amplifying unit 262 does not perform any operations regardless of the voltage level of the resistance sensing signal R_SENS_SIG while the second sensing and amplifying enable signal SAEN2 is inactivated to logic low and sustains the voltage levels of the amplified resistance sensing signals RSA_SIG and RSA_SIG# as an initial state. That is, the sensing and amplifying unit 262 controls the voltage levels of the main and sub amplified resistance sensing signals RSA_SIG and RSA_SIG# to be a supply voltage VDD level.

Among the constituent elements of the voltage level amplifier 260, the voltage level latch unit 264 does not perform any operations because a signal saving signal SAV_SIG is continuously sustained at a logic low state. That is, the voltage level latch unit 264 outputs the latched amplified resistance sensing signals RSA_SIG and RSA_SIG#, which were latched when the signal saving signal SAV_SIG is activated to logic high.

Since the sensing and amplifying circuit of the phase change memory device shown FIG. 2A further includes constituent elements for latching the independently sensed and amplified resistance sensing signals RSA_SIG and RSA_SIG# unlike the sensing and amplifying circuit of FIG. 1A, a point of time for inactivating the second sensing and amplifying enable signal SAEN2 to logic low is not necessary to be identical to a point of time for inactivating a word line selection signal WL<sel> to logic low.

Therefore, the sensing and amplifying circuit of FIG. 2A advantageously consumes less power than the sensing and amplifying circuit of FIG. 1A. However, the sensing and amplifying circuit of FIG. 2A also has some shortcomings. The sensing and amplifying circuit of FIG. 2A occupies a larger area because the sensing and amplifying circuit of FIG. 2A further includes constituent elements for latching the sensed and amplified resistance sensing signals RSA_SIG and RAS_SIG#.

As described above, the sensing and amplifying circuit according to the present embodiment consumes significantly less power by performing the operations step-by-step using the first and second sensing and amplifying enable signals SAEN1 and SAEN2, which are sequentially activated while a word line selection signal WL<sel> is activated to logic high and each of which has a certain activation period length.

In other words, the sensing and amplifying circuit according to the present embodiment firstly activates a resistance value sensing block and performs related operation corresponding to a first sensing and amplifying enable signal SAEN1 which is inactivated comparatively ahead. Then, the sensing and amplifying circuit according to the present embodiment activates a voltage level amplifying block for amplifying a voltage level of a resistance sensing signal R_SENS_SIG corresponding to the sensed resistance value and performs related operations corresponding to the second sensing and amplifying enable signal SAEN2 which is inactivated comparatively later. Therefore, the sensing and amplifying circuit according to the present embodiment activates the constituent elements thereof for a minimum time duration of performing related operation regardless of a period of retaining an activation state of a word line selection signal WL<sel>. As a result, the sensing and amplifying circuit according to the present embodiment consumes the minimum current.

Therefore, it is possible to minimize current flowing into each of phase change memory cells in a phase change memory device. It means that stress applied to each of the phase change memory cells is minimized. As a result, each of the phase change memory cell may stably operate longer.

As described above, the sensing and amplifying circuit according to the present embodiment consumes significantly less power by performing the operations step-by-step using the first and second sensing and amplifying enable signals SAEN1 and SAEN2, which are sequentially activated while a word line selection signal WL<sel> is activated to logic high and each of which has a certain activation period length.

Therefore, it is possible to minimize current flowing into each of phase change memory cells even during an activation period of a word line. Accordingly, stress applied to each of the phase change memory cells is minimized.

While the present invention has been described with respect to the specific embodiments, it will be apparent to those skilled in the art that various changes and modifications may be made without departing from the spirit and scope of the invention as defined in the following claims.

For example, the sensing and amplifying circuit according to the embodiments were described to use two sensing and amplifying enable signals for perform operations step-by-step. However, the present invention is not limited thereto. The sensing and amplifying circuit according to the present invention may use more than two sensing and amplifying enable signals.

Transistors may be modified in location and type according to polarity of an input signal.

What is claimed is:

1. A phase change memory device comprising:
a signal generator configured to generate first and second sensing and amplifying enable signals which are sequentially activated during an activation period of a word line selection signal and each of which has a certain activation period length, wherein the first sensing and amplifying enable signal is inactivated before an inactivation point of the word line selection signal;
a resistance sensor configured to sense a resistance value by applying a certain operation current to a phase change memory cell corresponding to the word line selection signal during an activation period of the first sensing and amplifying enable signal and determine a voltage level of a resistance sensing signal corresponding to the sensed result; and
a voltage level amplifier configured to logically determine a voltage level of the resistance sensing signal based on a voltage level of a logic reference signal during an activation period of the second sensing and amplifying enable signal and output amplified resistance sensing signals by amplifying the determined voltage level of the resistance sensing signal.

2. The phase change memory device of claim 1, wherein the voltage level amplifier receives the logic reference signal through a first input terminal, receives the resistance sensing signal through a second input terminal, differentially amplifies a voltage level of the resistance sensing signal based on a voltage level difference of the logic reference signal and the resistance sensing signal, and outputs the amplified resistance sensing signals with the amplified voltage level being maintained during the activation period of the second sensing and amplifying enable signal.

3. The phase change memory device of claim 2, wherein the signal generator includes:
a first sensing and amplifying enable signal generator configured to generate the first sensing and amplifying enable signal in response to a read command during an activation period of the word line selection signal; and
a second sensing and amplifying enable signal generator configured to generate the second sensing and amplifying enable signal in response to the first sensing and amplifying enable signal during the activation period of the word line selection signal.

4. The phase change memory device of claim 3, wherein the first sensing and amplifying enable signal generator activates the first sensing and amplifying enable signal in response to a read command after the word line selection signal is activated, and
wherein the first sensing and amplifying enable signal generator inactivates the first sensing and amplifying enable signal after a first time passes after the word line selection signal is activated, where the first time is a time point before the word line selection signal is inactivated.

5. The phase change memory device of claim 4, wherein the second sensing and amplifying enable signal generator activates the second sensing and amplifying enable signal after a second time passes after the first sensing and amplifying enable signal is activated, and
wherein the second sensing and amplifying enable signal generator inactivates the second sensing and amplifying enable signal when the word line selection signal is inactivated.

6. The phase change memory device of claim 1, wherein the resistance sensor includes:
a current applying unit configured to apply the operation current to a phase change memory cell corresponding to the word line selection signal in response to the first sensing and amplifying enable signal; and
a voltage level controller configured to decide a voltage level of the resistance sensing signal corresponding to a resistance value of a phase change memory cell corresponding to the word line selection signal sensed through operation of the current applying unit.

7. The phase change memory device of claim 6, wherein the current applying unit includes:
an operation current generator configured to generate the operation current in response to a current generation control signal; and a current path controller configured to control switching on/off of a path for transferring the operation current between the operation current generator and the phase change memory cell corresponding to the word line selection signal in response to the first sensing and amplifying enable signal.

8. The phase change memory device of claim 7, wherein the voltage level controller includes a dividing resistor having a certain resistance value and connected between the operation current generator and the current path controller and outputs the resistance sensing signal through a node disposed between the dividing resistance and the current path controller.

9. The phase change memory device of claim 1, wherein when a voltage level of the resistance sensing signal is higher than a voltage level of the logic reference signal while the second sensing and amplifying enable signal is activated, the voltage level amplifier determines a logic level of data stored in a phase change memory cell corresponding to the resistance sensing signal as logic high, amplifies the voltage level of the resistance sensing signal to a supply voltage level and outputs the amplified resistance sensing signals.

10. The phase change memory device of claim 9, wherein when a voltage level of the resistance sensing signal is lower than a voltage level of the logic reference signal while the second sensing and amplifying enable signal is activated, the voltage level amplifier determines a logic level of data stored in a phase change memory cell corresponding to the resistance sensing signal as logic low, amplifies the voltage level of the resistance sensing signal to a ground voltage level, and outputs the amplified resistance sensing signals.

11. The phase change memory device of claim 10, wherein when the second sensing and amplifying enable signal is inactivated, the voltage level amplifier performs no operation regardless of a voltage level of the resistance sensing signal and sustains a voltage level of an outputted amplified resistance sensing signal as an initial state.

12. The phase change memory device of claim 11, wherein the logic reference signal is inputted from an external device through an additional input pad or generated by an internal voltage generating circuit.

13. The phase change memory device of claim 1, wherein the signal generator is configured to activate the first sensing and amplifying enable signal in response to a read command, inactivate the first sensing and amplifying enable signal after a first time passes after the first sensing and amplifying enable signal is activated, and activate the second sensing and amplifying enable signal after a second time passes after the first sensing and amplifying enable signal is activated, and the second time is shorter than the first time.

14. A phase change memory device comprising:
a signal generator configured to generate first and second sensing and amplifying enable signals which are sequentially activated during an activation period of a word line selection signal and each of which has a certain activation period length, wherein the first sensing and amplifying enable signal is inactivated before an inactivation point of the word line selection signal;
a selected cell resistance sensor configured to sense a resistance value by applying a certain selected cell sensing operation current to a phase change memory cell corresponding to the word line selection signal during an activation period of the first sensing and amplifying enable signal and decide a voltage level of a resistance sensing signal corresponding to the sensed result;
a reference cell resistance sensor configured to sense a resistance value of a reference cell by applying a certain reference cell sensing operation current to the reference cell during an activation period of the first sensing and amplifying enable signal and decide a voltage level of a logic reference signal corresponding to the sensed result; and
a voltage level amplifier configured to logically determine a voltage level of the resistance sensing signal based on a voltage level of the logic reference signal during an activation period of the second sensing and amplifying enable signal, amplify the voltage level of the resistance sensing signal, and output amplified resistance sensing signals.

15. The phase change memory device of claim 14, wherein the voltage level amplifier receives the logic reference signal through a first input terminal, receives the resistance sensing signal through a second input terminal, differentially amplifies a voltage level difference of the logic reference signal and the resistance sensing signal, and outputs amplified resistance sensing signals with the amplified voltage level being sustained during an activation period of the second sensing and amplifying enable signal.

16. The phase change memory device of claim 15, wherein the signal generator includes:
a first sensing and amplifying enable signal generator configured to generate the first sensing and amplifying enable signal in response to a read command during an activation period of the word line selection signal; and
a second sensing and amplifying enable signal generator configured to generate the second sensing and amplifying enable signal in response to the first sensing and amplifying enable signal during the activation period of the word line selection signal.

17. The phase change memory device of claim 16, wherein the first sensing and amplifying enable signal generator activates the first sensing and amplifying enable signal in response to the read command after the word line selection signal is activated, and
wherein the first sensing and amplifying enable signal inactivates the first sensing and amplifying enable signal after a first time passes after the first sensing and amplifying enable signal is activated, which is before the word line selection signal is inactivated.

18. The phase change memory device of claim 17, wherein the second sensing and amplifying enable signal generator activates the second sensing and amplifying enable signal after a second time passes after the first sensing and amplifying enable signal is activated where the second time is shorter than the first time, and
wherein the second sensing and amplifying enable signal generator inactivate the second sensing and amplifying enable signal when the word line selection signal is inactivated.

19. The phase change memory device of claim 14, wherein the selected cell resistance sensor includes:
a selected cell current applying unit configured to apply the selected cell sensing operation current to a phase change memory cell corresponding to the word line selection signal in response to the first sensing and amplifying enable signal; and
a resistance sensing signal voltage level controller configured to decide a voltage level of the resistance sensing signal corresponding to a resistance value of a phase change memory cell corresponding to the word line selection signal, which is sensed through operation of the selected cell current applying unit.

20. The phase change memory device of claim 19, wherein the selected cell current applying unit includes:
- a selected cell sensing operation current generator configured to generate the selected cell sensing operation current in response to a current generation control signal; and
- a selected cell current path controller configured to control switching on/off of a path for transferring the selected cell sensing operation current between the selected cell sensing operation current generator and the word line selection signal in response to the first sensing and amplifying enable signal.

21. The phase change memory device of claim 20, wherein the resistance sensing signal voltage level controller includes a dividing resistor having a certain resistance value and connected between the selected cell sensing operation current generator and the selected cell current path controller and outputs the resistance sensing signal from a node disposed between the dividing resistor and the selected cell current path controller.

22. The phase change memory device of claim 14, wherein the reference cell resistance sensor includes:
- a reference cell current applying unit configured to apply the reference cell sensing operation current to the reference cell in response to the first sensing and amplifying enable signal; and
- a logic reference signal voltage level controller configured to decide a voltage level of the logic reference signal corresponding to a resistance value of the reference cell, which is sensed through operation of the reference cell current applying unit.

23. The phase change memory device of claim 22, wherein the reference cell current applying unit includes:
- a reference cell sensing operation current generator configured to generate the reference cell sensing operation current in response to a current generation control signal; and
- a reference cell current path controller configured to control switching on/off of a path for transferring the reference cell sensing operation current between the reference cell sensing operation current generator and the reference cell in response to the first sensing and amplifying enable signal.

24. The phase change memory device of claim 23, wherein the logic reference signal voltage level controller includes a dividing resistance having a certain resistance value and connected between the reference cell sensing operation current generator and the reference cell current path controller and outputs the logic reference signal through a node disposed between the dividing resistance and the reference cell current path controller.

25. The phase change memory device of claim 14, wherein when a voltage level of the resistance sensing signal is higher than a voltage level of the logic reference signal during an activation period of the second sensing and amplifying enable signal, the voltage level amplifier determines a voltage level of data stored in a phase change memory cell corresponding to the resistance sensing signal, and outputs the amplified resistance sensing signals by amplifying a voltage level of the resistance sensing signal to a supply voltage level.

26. The phase change memory device of claim 25, wherein when a voltage level of the resistance sensing signal is lower than a voltage level of the logic reference signal during an activation period of the second sensing and amplifying enable signal, the voltage level amplifier determines a logic level of data stored in a phase change memory cell corresponding to the resistance sensing signal is low and outputs the amplified resistance sensing signals by amplifying a voltage level of the resistance sensing signal to a ground voltage level.

27. The phase change memory device of claim 26, wherein the voltage level amplifier performs no operation regardless of a voltage of the resistance sensing signal during an inactivation period of the second sensing and amplifying enable signal and retains voltage levels of the amplified resistance sensing signals as an initial state.

28. The phase change memory device of claim 14, further comprising a plurality of phase change memory cells arranged in array that include said phase change memory cell corresponding to the word line selection signal.

29. The phase change memory device of claim 14, wherein the signal generator is configured to activate the first sensing and amplifying enable signal in response to a read command, inactivate the first sensing and amplifying enable signal after a first time passes after the first sensing and amplifying enable signal is activated, and activate the second sensing and amplifying enable signal after a second time passes after the first sensing and amplifying enable signal is activated, and the second time is shorter than the first time.

* * * * *